(12) United States Patent  
Smith

(10) Patent No.: US 7,092,073 B2  
(45) Date of Patent: Aug. 15, 2006

(54) METHOD OF ILLUMINATING A PHOTOMASK USING CHEVRON ILLUMINATION

(75) Inventor: Bruce W. Smith, Penfield, NY (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/312,995

(22) PCT Filed: Jul. 6, 2001

(86) PCT No.: PCT/US01/21400

§ 371 (c)(1),
(2), (4) Date: Aug. 4, 2003

(87) PCT Pub. No.: WO02/05029

PCT Pub. Date: Jan. 17, 2002

(65) Prior Publication Data

US 2004/0048167 A1    Mar. 11, 2004

Related U.S. Application Data

(60) Provisional application No. 60/216,881, filed on Jul. 7, 2000.

(51) Int. Cl.
*G03B 27/52* (2006.01)
*G03B 27/54* (2006.01)
*G03F 1/00* (2006.01)

(52) U.S. Cl. ............................. 355/71; 355/67; 430/5
(58) Field of Classification Search .................. 355/53, 355/67, 71, 77; 430/5; 359/894
See application file for complete search history.

(56) References Cited

U.S. PATENT DOCUMENTS

| | | | |
|---|---|---|---|
| 5,286,963 A | | 2/1994 | Torigoe |
| 5,305,054 A | * | 4/1994 | Suzuki et al. .................. 355/53 |
| 5,367,404 A | * | 11/1994 | Hayata .......................... 359/558 |
| 5,447,810 A | | 9/1995 | Chen et al. |
| 5,546,225 A | | 8/1996 | Shiraishi |
| 5,576,801 A | | 11/1996 | Ushida et al. |
| 5,627,626 A | * | 5/1997 | Inoue et al. ................... 355/67 |
| 5,804,336 A | | 9/1998 | Rolfson |
| 5,817,439 A | | 10/1998 | Tzu et al. |
| 5,926,257 A | | 7/1999 | Mizouchi |
| 6,048,647 A | | 4/2000 | Miyazaki et al. |
| 6,080,527 A | | 6/2000 | Huang et al. |
| 6,106,979 A | | 8/2000 | Pierrat |

FOREIGN PATENT DOCUMENTS

| | | |
|---|---|---|
| EP | 0 526 242 A1 | 2/1993 |
| JP | 61-91662 * | 5/1986 |
| WO | WO 02/05029 A1 * | 1/2002 |

* cited by examiner

*Primary Examiner*—Alan Mathews
(74) *Attorney, Agent, or Firm*—Pillsbury Winthrop Shaw Pittman LLP

(57) ABSTRACT

A microlithograpic tool, such as a projection stepper, for manufacturing integrated circuits, shapes light that illuminates a photomask with a chevron illumination system. The system uses either a chevron aperture mask of diffractive optical elements to shape a light source into four chevrons (110*b*, 120*b*, 130*b*, 140*b*). The chevrons are located in the corners of the circular pupil of the condenser lens. The chevrons may be a small a square poles at the corners or as large as an annular square ring. The chevrons provide superior performance for illuminating conventional X and Y oriented features of a photomask.

19 Claims, 6 Drawing Sheets

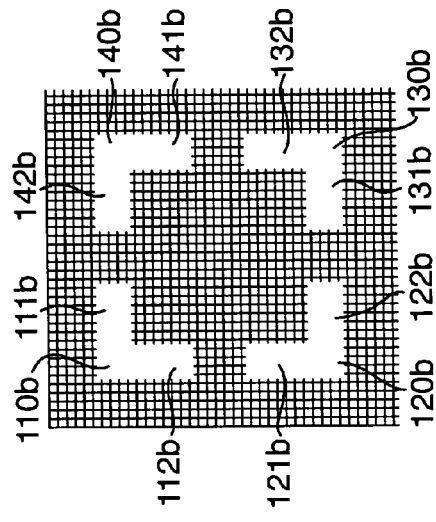
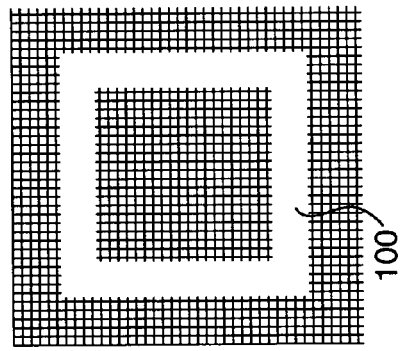
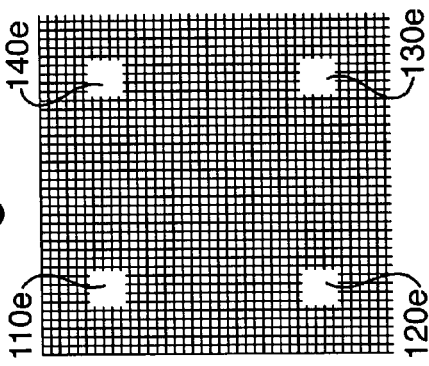
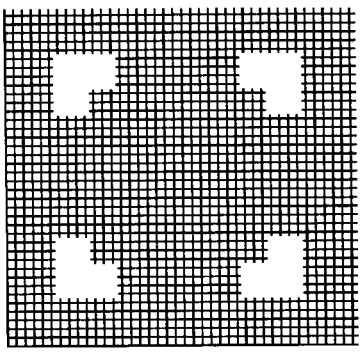
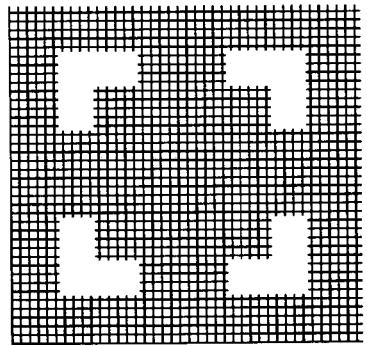

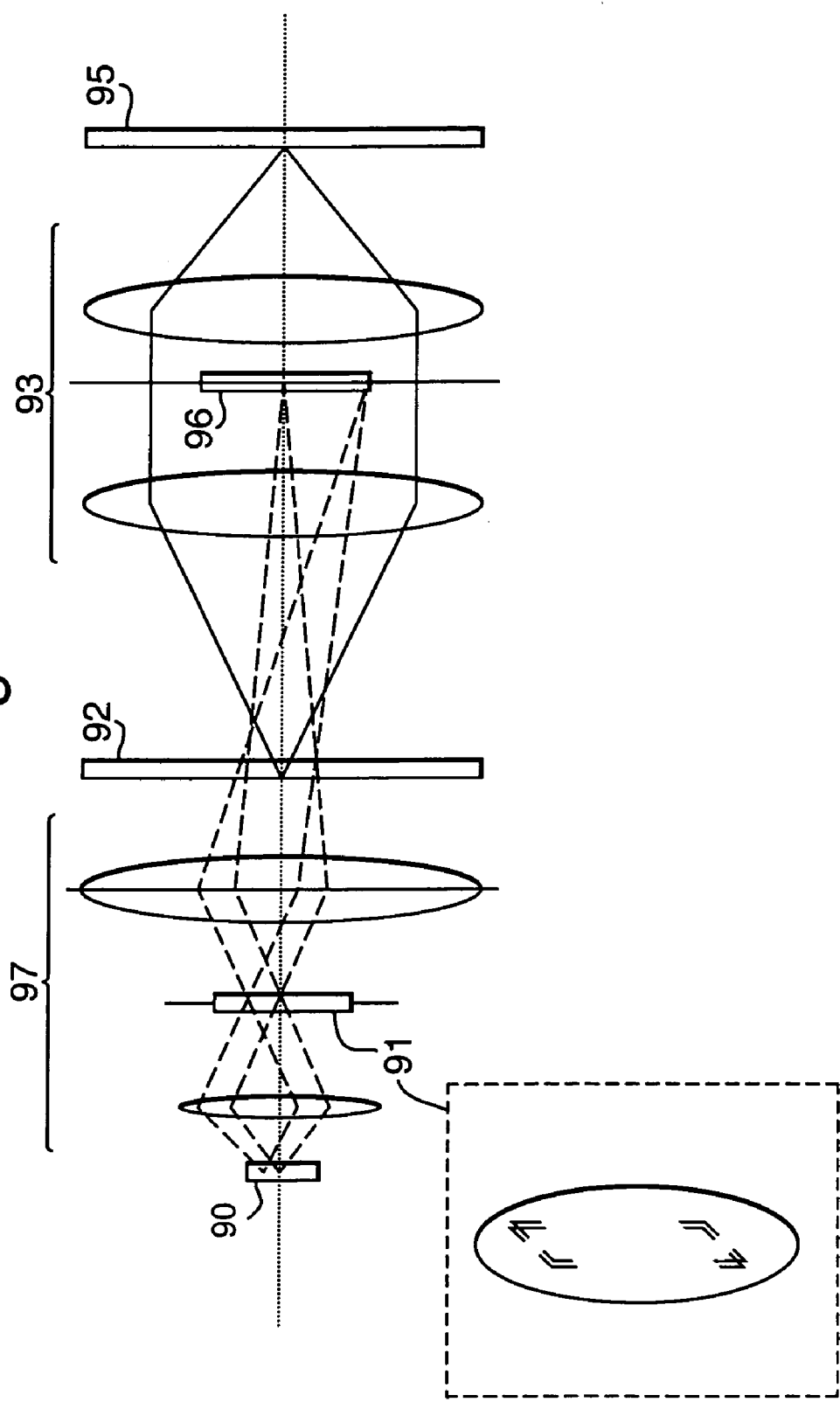

METHOD OF ILLUMINATING A PHOTOMASK USING CHEVRON ILLUMINATION

CROSS-REFERENCE TO RELTED APPLICATIONS

This application is the National Phase of International Application PCT/US01/21400 filed Jul. 6, 2001 which designated the U.S. and claims priority to U.S. Provisional Patent Application No. 60/216,881, filed on Jul. 7, 2000, and that International Application was published under PCT Article 21(2) in English as PCT Patent Application Publication WO 02/05029.

FIELD OF INVENTION

The present invention relates to the field of semiconductor lithography, more specifically to the illumination of a photomask for imaging improvement.

BACKGROUND OF THE INVENTION

Semiconductor lithography utilizing optical imaging systems has been carried out for many years. The process involves the creation of relief image patterns through the projection of radiation within or near the UV visible portion of the electromagnetic spectrum. Earlier methods of optical semiconductor lithography utilized a proximity printing technique, where a photomask with the desired device pattern image was held close to the surface of a photosensitized silicon wafer surface, transferring the image the image to the surface. Resolution, device size, and device yield are limited using this approach because of the lack of reduction optics. Modern reduction projection techniques using step-and-repeat or step-and-scan optical systems minimize some of the problems encountered with earlier proximity lithography methods and have lead to the development of tools that currently allow resolution below 0.15 µm.

Semiconductor device features are generally on the order of the wavelength of the ultraviolet (UV) radiation used to pattern them. Currently, exposure wavelengths are on the order of 150 to 450 nm and more specifically 157 nm, 293 nm, 248 nm, 365 nm, and 436 nm. The most challenging lithographic features are those which fall near or below sizes corresponding to $0.5\lambda/NA$, where $\lambda$ is the exposing wavelength and NA is the objective lens numerical aperture of the exposure tool. As an example, for a 193 nm-wavelength exposure system incorporating a 0.65NA objective lens, the imaging of features at or below 0.13 micrometers is considered state of the art. Generally, systems employ Köhler type illumination and an effective source that is shaped circularly. More recently, source shapes have been varied from this conventional circular shape to best optimize illumination conditions for a specific photomask pattern, wavelength, NA, and other imaging parameters. Off axis illumination using dipole illumination, with a pair or circular source shapes oriented in the direction of mask geometry can offer a significant enhancement to imaging performance. This is because only oblique illumination at an optimized illumination angle can be designed to allow projection of a single orientation of mask diffraction energy at the outermost edges of an objective lens pupil. The problem with dipole illumination arises when geometry of both X and Y (or horizontal and vertical) nature is considered since imaging is limited to features oriented along one direction in an X–Y plane. Additionally, the use of circular pole shapes could be improved by using poles with square or rectangular shaping. Four pole or quadrupole source shapes are an example of a modification for X and Y oriented geometry [see for instance U.S. Pat. No. 5,305,054]. Here, four circular poles are utilized to accommodate the mask geometry located along two orthogonal axes. The use of multiple circular shaped poles is not the best shaping for use with mask geometry oriented on orthogonal X and Y-axes however. I have discovered that particular square pole shapes extended along X and Y axes, forming chevron shapes at the corners of an illumination source, show superior performance to other illumination approaches.

SUMMARY OF THE INVENTION

The present invention is a unique approach to shaping illumination. It can be implemented by placing an aperture in the pupil plane of the condenser lens or illumination system or by shaping illumination using optical means including diffractive optical elements (DOEs) or other similar elements, beam splitters or other similar methods.

One object of the present invention is to provide off-axis illumination that is optimized for mask features oriented along orthogonal X and Y-axes as most semiconductor devise geometry is oriented along these directions. A second object of this invention is to remove the illumination source shaping that is not optimal for semiconductor device geometry oriented along orthogonal X and Y-axes.

Another object of this invention is to allow for the control of the ratio of on-axis to off-axis illumination shaping by means of modification to the shape of the illumination source along X and Y axes.

Another object of the present invention is to provide illumination shaping that can be implemented in a projection imaging system through various means, including the use of diffractive optical elements (DOEs), beam splitters, aperture plates or masks, or other optical means.

These objects are achieved using a particular illumination shaping where four regions of illumination are provided and these regions are defined by boundaries that lie on X and Y axes. More specifically, these regions are "L" shaped, where the horizontal and vertical segments are varied in size between two limits. The first limit is where the horizontal and vertical segments of the four "L" shapes form squares, where the length and width of the two segments are equal. The second limit is where the length of the horizontal and vertical segments of the four "L" shapes is such that each form a connection with the neighboring "L" shapes in horizontal and vertical directions, resulting in a continuous square ring of illumination.

The aperture mask of the invention may be formed on a translucent or transparent substrate, such as quartz, with chevron openings in an opaque coating or from a solid, opaque metal plate with chevron openings in the plate. The chevrons are located in the four corner regions of the plate. Each chevron includes a square region located in the corner and first and second legs extending from said square transparent region and in a direction toward adjacent corners. The chevrons may be varied in size from as small as four square corners to as large as a square annular ring around a central opaque region.

BRIEF DESCRIPTION OF THE FIGURES

FIGS. 1a–1e show Chevron illumination distributions with increasing edge obscuration, FIG. 1a, none or square ring, FIG. 1b, 0.25, FIG. 1c, 0.50, FIG. 1d, 0.75, and FIG. 1e, 1.0 or square quadrupole.

FIG. 2 shows the implementation of the invention in a projection lithography tool using an aperture mask in the illuminator.

DESCRIPTION OF THE INVENTION

Figure 3:
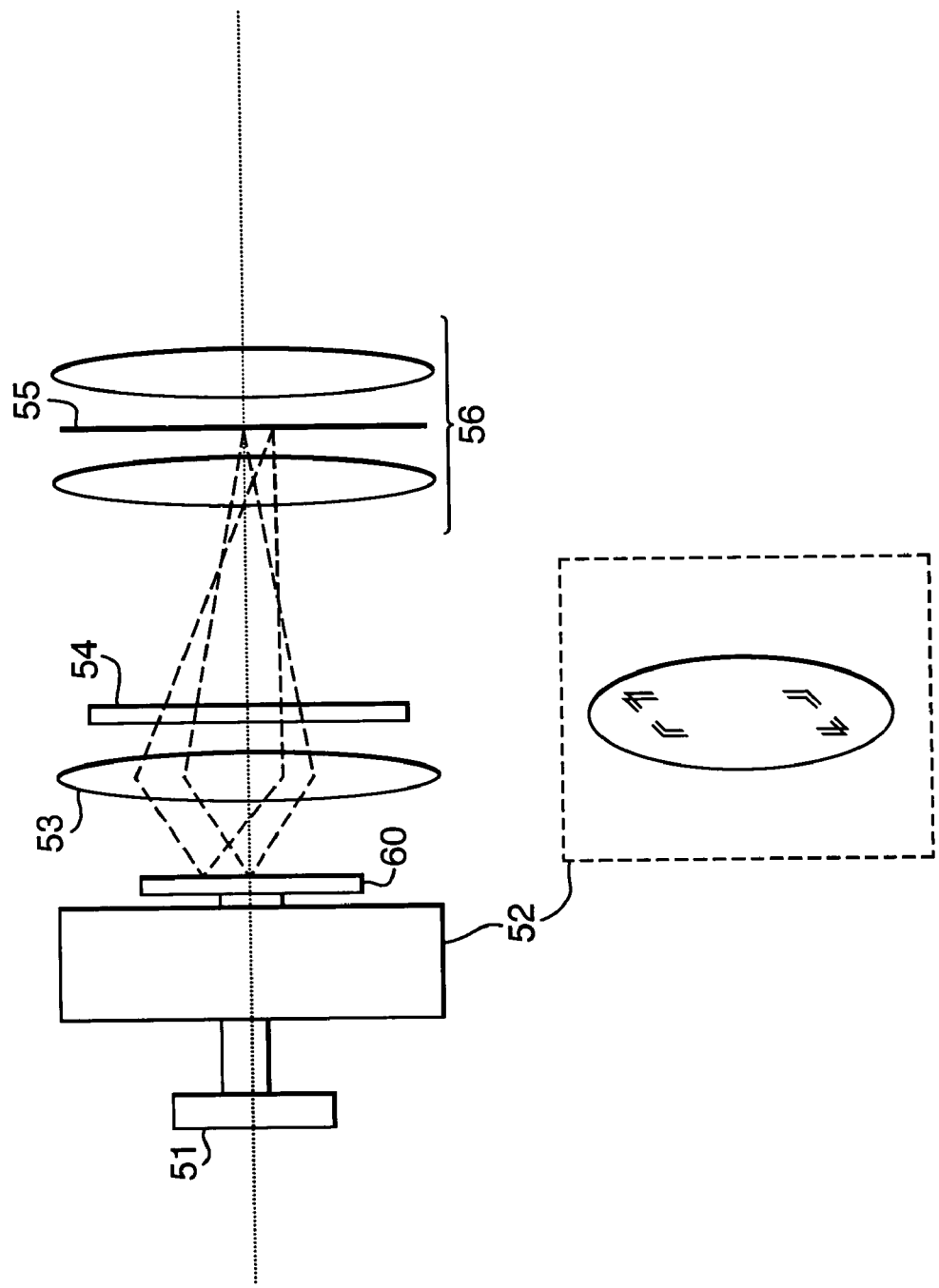
FIG. 3 is a beam shaping method for chevron-shaped illumination.

The present illumination method is referred to as chevron illumination. Examples of chevron illumination plates are shown the FIGS. 1a-1e. The chevrons are formed and sized to fit into a circular pupil of a conventional illumination system. FIGS. 1a–1e show several examples from a full square ring to four square poles. The solutions between these extremes are the Chevron shapes. These shapes show improvement beyond either the quadrupole or the ASML-Quasar(TM) shaping currently utilized in projection systems.

In one embodiment of the invention the illumination plates are formed by conventional photomask technology. A transparent quartz substrate is covered with an opaque coating, typically chrome. The substrate is covered with a photoresist and the chevron patterns are exposed in the resist. Exposure is typically by an electron beam apparatus is a manner well know to those skilled in the art. In another embodiment, a solid metal plate is fabricated to have chevron openings in its corners.

Turning to FIG. 1b, there is shown an aperture mask with four chevrons 110b, 120b, 130b and 140b. The chevrons have respective pairs of legs 111b, 112b, 121b, 122b, 131b, 132b, and 141b, 142b. The legs extend toward adjacent corners. The chevrons in successive FIGS. 1c–1e become progressively smaller until the chevrons 120e, 130e, 140e and 150e in FIG. 1e are simple transparent squares in the chrome covering of a quartz substrate or are openings in the metal substrate. In FIG. 1a, the chevrons meet between the adjacent corners to form an annular rectangular or square ring 100.

Those skilled in the art understand that the preferred embodiments have openings with equal dimensions in both horizontal (X) and vertical (Y) directions. In that way, the source image is equally shaped in both its X and Y dimensions. However, if desired, the openings could be different in the X and Y directions to emphasize one dimension over the other. Köhler illumination systems are used extensively in lithographic applications and are well known. The present invention is implemented in existing Köhler illumination systems via access to the illumination optical system. One example is shown in FIG. 2. Here, a light source 90 generates a light beam that is directed through a condenser lens system 97. Within this system, an aperture mask 91 is placed in the condenser lens pupil plane. The mask 91 controls the shape of the light beam into the chevron-shaped intensity distribution. The condenser lens focuses an image of the chevron shaped light source on the pupil plane 96 of the objective lens system 93. The photomask 92 is positioned at the object plane of the objective lens system 93 and is illuminated by the chevron shaped light source image. An image of the photomask 92 is projected through the objective lens system 93 toward its image plane 95. The aperture mask may be either a chrome covered substrate with chevron openings in the chrome or a solid, opaque substrate with chevron openings.

FIG. 3 shows another example with a beam-shaping optical system of an illumination system that is modified to produce the desired chevron-shaped illumination. The illumination optical system contains a beam shaping optical system 52 and optical integrator 60. A light source such as a lamp or an excimer laser 51 is used for illumination. The beam shaping optical system 52 shapes the light beam coming from source 51 into the chevron shape and directs this shaped beam onto the surface of an optical integrator 60. The optical integrator can consist of, for example, a fly's eye array or one or more diffractive optical elements. The condenser lens system 53 illuminates the mask with Köhler illumination. The intensity distribution in the mask plane 54 is a result of the chevron shaping of the illuminator and is the Fourier Transform of the illuminated shape. An image of the chevron source shaping is also produced in the objective lens system 56-pupil plane 55. Diffractive optical elements (DOEs), also known as binary optical elements (BOEs), are often employed in the illumination systems of lithographic tools as beam shaping components. A diffractive optical element operates on the principle of diffraction. Traditional optical elements use their shape to bend light. Diffractive optics work as Fourier Transform lenses to form desired optical effects. DOE pattern technology produces multiple phase levels by using ion etching methods, resulting in deflection angles large enough to allow for shaping that is generally circular in nature. The use of such elements in lithographic systems can be found for instance in U.S. Pat. No. 5,926,257 where a set of DOEs is used to form circular Köhler illumination. In U.S. Pat. No. 5,631,72, an array of diffractive optical elements is placed on or near the focal point of the condenser to generate a desired circular angular distribution with little dependence on the illumination source profile. Fabrication methods such as those described in U.S. Pat. Nos. 6,120,950 and 5,227,915 are well known to those of ordinary skill in the art of diffractive optics. The beam shaping optical system 52 can contain one or more diffractive optical elements to achieve the chevron shaping using these fabrication methods.

Imaging results using the present invention are presented. The five chevron-shaped illumination shapes used are those shown in FIG. 1. The five designs (a through e) have increasing edge obscuration, from none or zero to full or 1.0, where zero obscuration is a full ring and 1.0 is a square quadrupole. The width of the segments of the four illumination regions is such that the outside edge of the illumination regions extend to 0.7 of a full unity sigma pupil and the inside edge is 0.5 of a full pupil. The intensity in the open areas of the patterns is 1.0 and the intensity in the neighboring region is zero. Image evaluation has been carried out for an imaging system with an objective lens NA of 0.75 and a wavelength of 248 nm for 130 nm line features with pitch values from 1:1 to 1:4, corresponding to 260 nm to 650 nm pitch values respectively. Evaluation has been carried out using a vector aerial image model to incorporate imaging parameters. The metric of evaluation using the slope of the logarithm of the intensity image (known as the aerial image) has been used. A sharper image is one that possesses a larger value of this metric. Evaluation has been performed for imaging though a range of focus values. It is desirable that sharp images are produced though as large a variation of focus as possible. Imaging results using the five variations on the chevron shaped illumination have been compared to those for a quadrupole illumination, known as ASML Quasar(TM) illumination, defined with an inner sigma value of 0.5, an outer sigma value of 0.8 and an arc definition of 30°. Results are shown in FIGS. 4 through 9. The imaging performance are summarized as follows.

Figure 4:
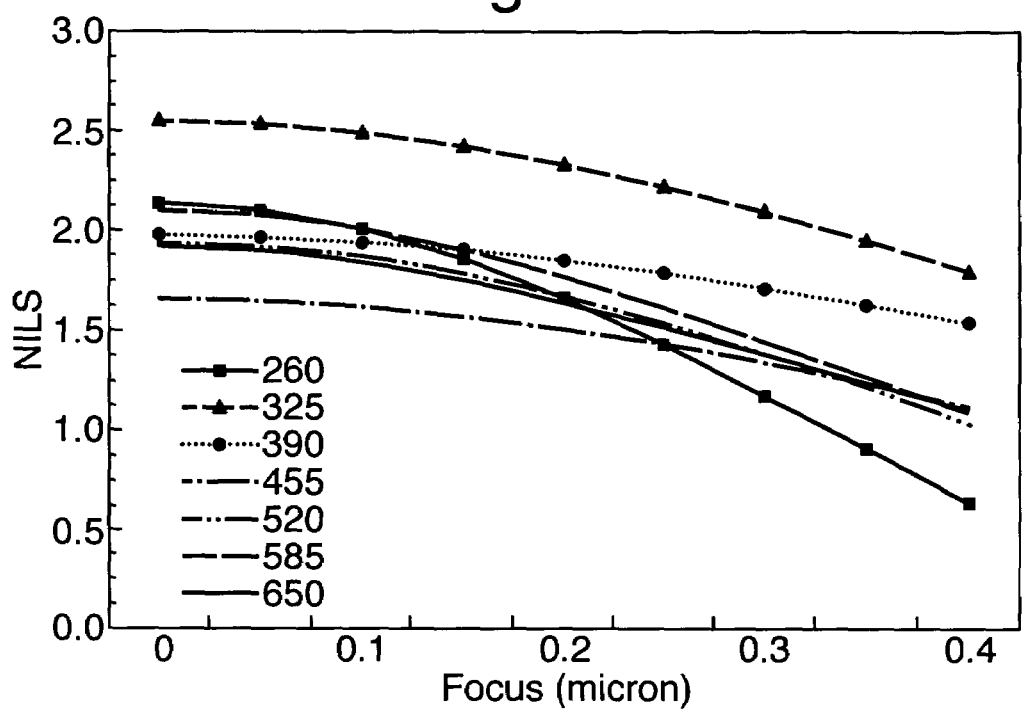
FIG. 4 shows results of image evaluation using NILS vs. focus for 130 nm lines on various pitch values using the ASML-Quasar(TM) illumination, with parameters (outer sigma/inner sigma/opening angle) of 0.8/0.5/30°.
Figure 5:
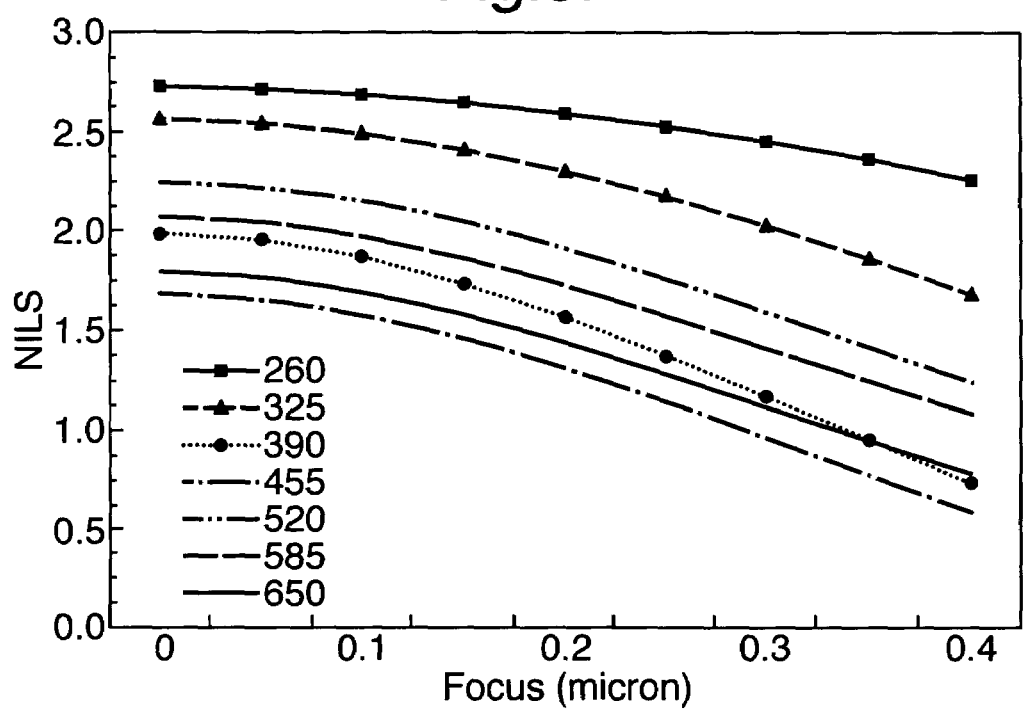
FIG. 5 shows results of image evaluation using NILS vs. focus for 130 nm lines on various pitch values using the chevron "e" illuminator.

The through-pitch NILS vs. focus (where NILS is defined as the product of feature size and the slope of the log of the aerial image, and where larger NILS values are desired) for the ASML-Quasar(TM) design evaluated in FIG. 4 show how NILS values above 1.5 can be achieved through a defocus near 0.25 microns, but the difference between isolated and dense feature performance (referred to as proximity bias) is significant and may not be desirable The performance of the chevron shaping shown in FIG. 1e is shown in FIG. 5, where the smallest pitch features is improved over the ASML-Quasar(TM) but proximity bias is increased. This shows how this variation to the chevron-shaped illumination can be used for image improvement through a large variation in focus if proximity bias is not a concern.

Figure 6:
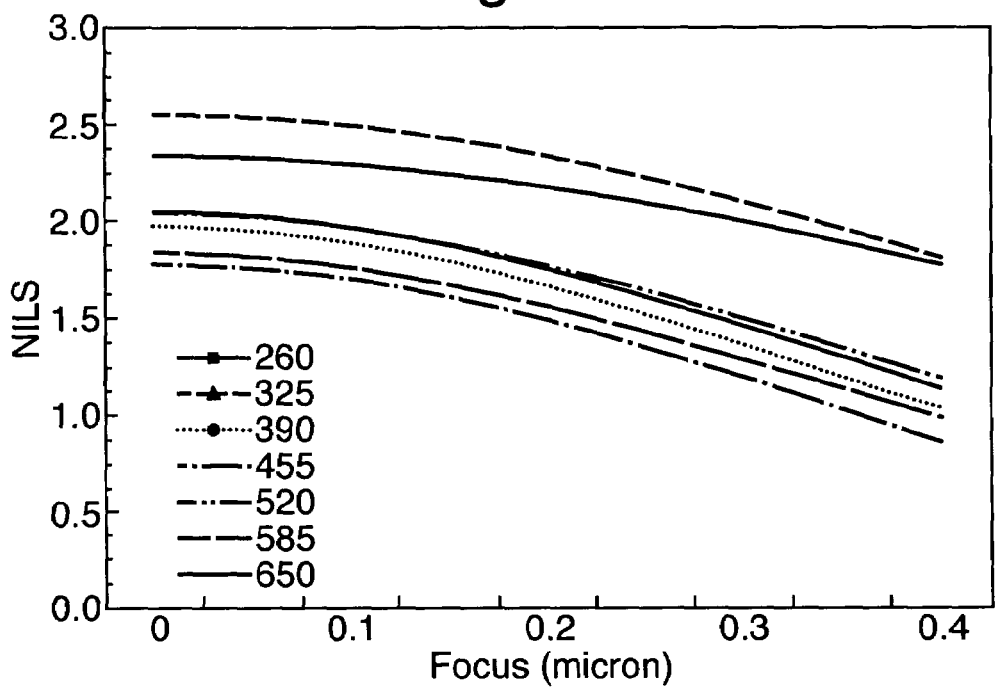
FIG. 6 shows results of image evaluation using NILS vs. focus for 130 nm lines on various pitch values using the chevron "d" illuminator.

FIG. 6 shows the results for chevron design of FIG. 1d where the 260 nm pitch performance is better than that for the ASML-Quasar(TM) and proximity bias is reduced over FIG. 5. This shows how the control over the specific chevron shaping can lead to controlled variation in imaging performance through focus and proximity bias.

Figure 7:
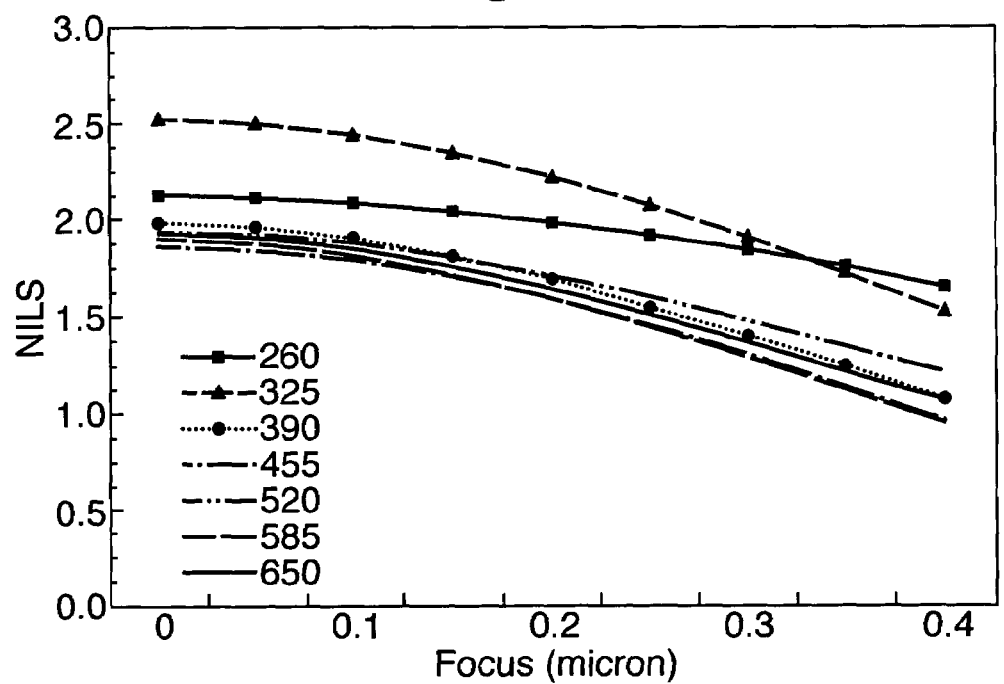
FIG. 7 shows results of image evaluation using NILS vs. focus for 130 nm lines on various pitch values using the chevron "c" illuminator.

FIG. 7 shows the best overall performance of the chevron is for the chevron of FIG. 1c. The NILS through focus is superior to the ASML-Quasar(TM) and the proximity bias is reduced. This is the superior result.

Figure 8:
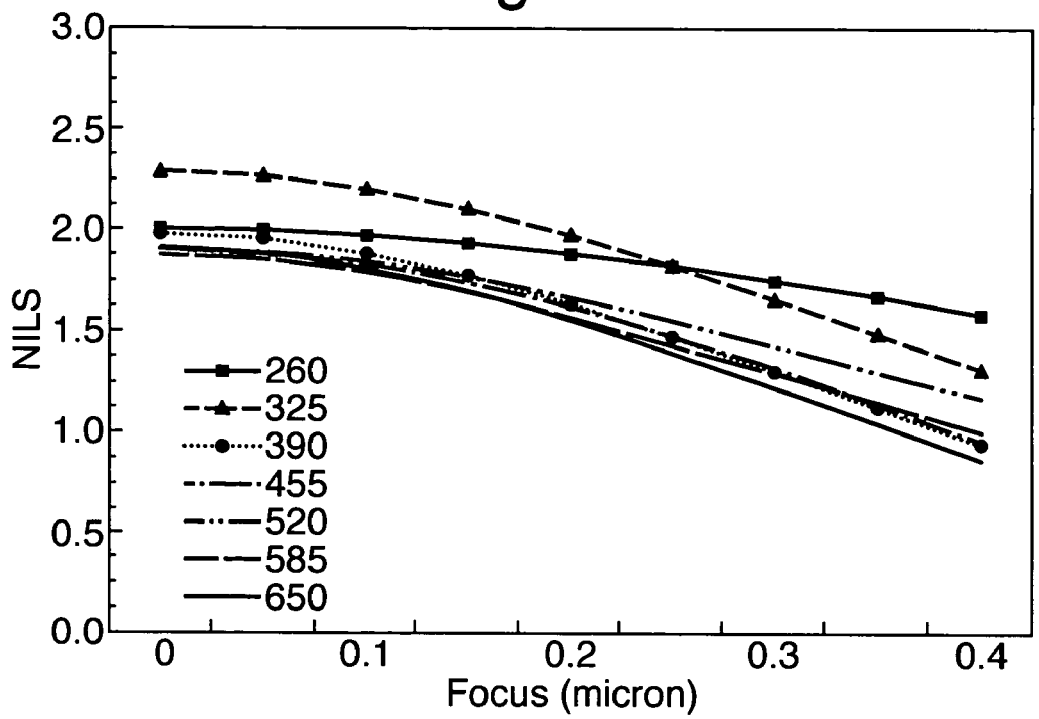
FIG. 8 shows results of image evaluation using NILS vs. focus for 130 nm lines on various pitch values using the chevron "b" illuminator.

FIG. 8 shows the result for the chevron design of FIG. 1b. It demonstrates how the chevron shaping can allow for control over proximity bias and performance, which can allow the source shaping to be tailored to specific imaging and process requirements.

Figure 9:
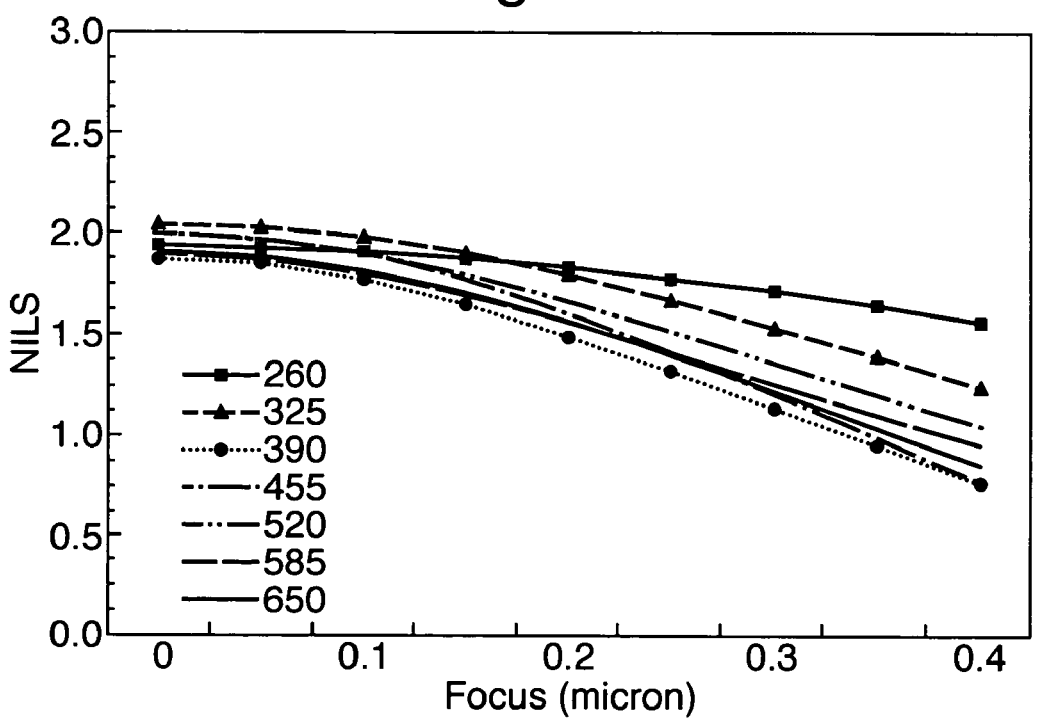
FIG. 9 shows results of image evaluation using NILS vs. focus for 130 nm lines on various pitch values using the Chevron "a" illuminator.

FIG. 9 shows the result for the chevron design of FIG. 1a, which is a square ring. The square ring shows best isolated to dense process overlap, or minimal proximity bias.

The results show the significance of the invention. When geometry is oriented along X/Y directions (as is the requirement for a quadrupole type illumination application), it is most beneficial to use an illumination source which projects energy to X and Y axes. This is accomplished with the chevron-shaped designs and cannot be accomplished using a circular quadrupole or ASML-Quasar(TM) illumination.

Although the present invention has been described, it is to be understood that it is not limited to these descriptive examples. The described embodiments are not necessarily exclusive and various changes and modifications in methods, designs, and placement may be made thereto without departing from the scope of the invention as described here.

What I claim is:

1. A photolithographic system for forming finely spaced features on a photosensitized surface of a semiconductor substrate, comprising:

a light source for illuminating a photomask covered with a pattern that will be transferred to the photosensitized surface of the semiconductor substrate; and an aperture mask disposed between the light source and the semiconductor substrate, the aperture mask comprising a translucent substrate having an opaque coating and four transparent corner regions, wherein each transparent corner region comprises a chevron including a square transparent region located in a corner of the translucent substrate and first and second legs extending from said square transparent region in a direction substantially perpendicular to a side of said square region toward adjacent corners, and at least a portion between pairs of adjacent corners having the opaque coating.

2. The photolithographic system of claim 1, wherein the first and second legs of the chevron extend less than half a length of a distance between adjacent corners.

3. A photolithographic system for forming finely spaced features on a photosensitized surface of a semiconductor substrate comprising:

an objective lens system having a pupil plane and an image plane for focusing an image of a photomask pattern located at said pupil plane onto the sensitized surface of the semiconductor substrate located at said image plane;

an illumination system comprising a light source and a condenser lens for focusing an image of the light source onto said pupil plane of said objective lens system;

a diffractive optical element disposed between the light source and the condenser lens; and an optical integrator disposed between the diffractive optical element system and the semiconductor wafer, wherein the diffractive optical element shapes light from the light source into chevron image patterns, wherein each chevron image pattern is located at a corner of a pupil plane of the illumination system and each chevron image pattern has first and second legs extending from said corner in a direction toward adjacent corners.

4. The photolithographic system of claim 3, wherein the first and second legs of the chevron image patterns extend half a length of a distance between adjacent corners.

5. The photolithographic system of claim 4, wherein the chevrons images patterns form a rectangular annular pattern surrounding an obscure rectangular central region.

6. A photolithographic system for forming finely space features on a photosensitized surface of a semiconductor substrate comprising:

an objective lens system having a pupil plane and an image plane for focusing an image of a photomask pattern located at said pupil plane onto the sensitized surface of the semiconductor substrate located at said image plane;

an illumination system having a light source and a condenser lens for focusing an image of the light source onto said pupil plane of said objective lens system; and a light shaping device configured to shape light from the light source into chevron image patterns, each chevron image pattern being located in a corner of a pupil plane of the illumination system, wherein each chevron image pattern has a rectangular area located in said corner and first and second legs extending from said rectangular area in a direction substantially perpendicular to a side of said rectangular area toward adjacent corners, without meeting legs of respective adjacent chevrons.

7. The photolithographic system of claim 6, wherein the light shaping device comprises a diffractive optical element disposed between the light source and the condenser lens for shaping light from the light source into chevron image patterns.

8. The photolithographic system of claim 6, wherein the light shaping device comprises an aperture mask disposed between the light source and the condenser lens, the aperture mask comprising an opaque coating and four transparent corner regions, each transparent corner region comprising a chevron including a square transparent region located in the corner region and first and second legs extending from said square transparent region and in a direction toward adjacent corners.

9. A method for forming finely space features on a photosensitized surface of a semiconductor wafer comprising:
shaping light from a light source into chevron image patterns, each chevron image pattern located in a corner of a pupil plane of a condenser lens and having a rectangular area and first and second legs extending from said rectangular area in directions substantially perpendicular to a side of said rectangular area toward adjacent corners, such that at least a portion of the pupil plane between pairs of adjacent corners is not illuminated;
focusing the chevron image patterns onto a photomask disposed in a pupil plane of an objective lens system;
focusing an image of the photomask pattern onto the sensitized surface of said semiconductor substrate located at an image plane of said objective lens systems for transferring the pattern on said photomask to the sensitized surface of the semiconductor substrate.

10. The method of claim 9, wherein shaping light comprises diffracting light from the light source into chevron shaped images.

11. The method of claim 10, wherein shaping light comprises inserting an aperture mask between the light source and the condenser lens and providing transparent chevron openings in an opaque coating on the aperture mask.

12. An aperture mask for a photolithographic system comprising:
a transparent substrate; and
an opaque covering disposed on said substrate, said opaque covering defining four transparent regions, each transparent region located in one of four corners of said aperture mask,
wherein each of said transparent regions has a L-like configuration and each leg of the L-like configuration extends toward a leg of another L-like configuration of another transparent region without reaching the another L-like configuration.

13. The aperture mask of claim 12, wherein each of the four transparent regions comprises a rectangular transparent region.

14. The aperture mask of claim 13, wherein the rectangular transparent region is a square transparent region.

15. The aperture mask of claim 14, wherein each transparent region comprises a chevron, the chevron including the square transparent region and first and second legs extending from said square transparent region in a direction toward adjacent corners.

16. The aperture mask of claim 15, wherein the first and second legs of all chevrons have a same length.

17. The aperture mask of claim 16, wherein the first and second legs of chevrons extend less than half a length of a distance between adjacent corners.

18. An aperture mask for a photolithographic system comprising:
a mask comprising an opaque coating, the opaque coating defining four transparent corner regions;
wherein each transparent corner region comprises a chevron including a square transparent region located in the corner and first and second legs extending from said square transparent region in a direction substantially perpendicular to a side of said square transparent region toward adjacent corners and an opaque region separating adjacent ones of said transparent regions.

19. The aperture mask of claim 18, wherein the first and second legs of chevrons extend less than half a length of a distance between adjacent corners.

* * * * *